(12) United States Patent
Wang et al.

(10) Patent No.: US 6,853,941 B2
(45) Date of Patent: Feb. 8, 2005

(54) OPEN-LOOP FOR WAVEFORM ACQUISITION

(75) Inventors: Hui Wang, Newark, CA (US); Kenichi Kanai, Palo Alto, CA (US); Hiroyasu Koike, Tokyo (JP)

(73) Assignee: NPTest, Inc., San Jose, CA (US)

( * ) Notice: Subject to any disclaimer, the term of this patent is extended or adjusted under 35 U.S.C. 154(b) by 0 days.

(21) Appl. No.: 10/136,710

(22) Filed: Apr. 30, 2002

(65) Prior Publication Data

US 2003/0016153 A1 Jan. 23, 2003

Related U.S. Application Data

(60) Provisional application No. 60/287,787.

(51) Int. Cl.[7] .............................................. G01R 31/00
(52) U.S. Cl. ........................................ 702/117; 324/158
(58) Field of Search .............................. 702/17; 324/751, 324/750; 341/155; 439/66

(56) References Cited

U.S. PATENT DOCUMENTS 5,093,616 A * 3/1992 Seitoh et al. ............ 324/158 R
5,416,426 A * 5/1995 Okubo et al. ................ 324/751
5,638,005 A   6/1997 Rajan et al. ................ 324/751

FOREIGN PATENT DOCUMENTS

EP   0 747 716 A   12/1996

OTHER PUBLICATIONS

H. Fujioka, "An Open Loop Spectroscopy for Quantitive Waveform Measurements With The Scanning Electron Microscope", Journal of Physics (Scientific Instruments), vol. 18, No. 4, Apr. 1985 pp. 284–285 UK.
Long, J.T. L., "Electron Beam Testing Technology, Microdevices Physics and Fabrication Technologies", Plenum, 1993, New York (pp. 44–45).

* cited by examiner

Primary Examiner—John Barlow
Assistant Examiner—Victor J. Taylor
(74) Attorney, Agent, or Firm—Fish & Richardson P.C.

(57) ABSTRACT

Methods and apparatus, including computer program products, implementing and using techniques for open-loop waveform acquisition. In general, in one aspect, the invention provides a method for open-loop waveform acquisition. The method includes acquiring an S-curve of an acquisition loop of an electron-beam probe system. The S-curve represents a response of the acquisition loop to changes of potential differences between the acquisition loop and a device under test. The method includes calibrating the acquisition loop to obtain a linear region in the acquired S-curve and using the linear portion of the acquired S-curve to calculate voltage at a probe point of the device under test.

19 Claims, 7 Drawing Sheets

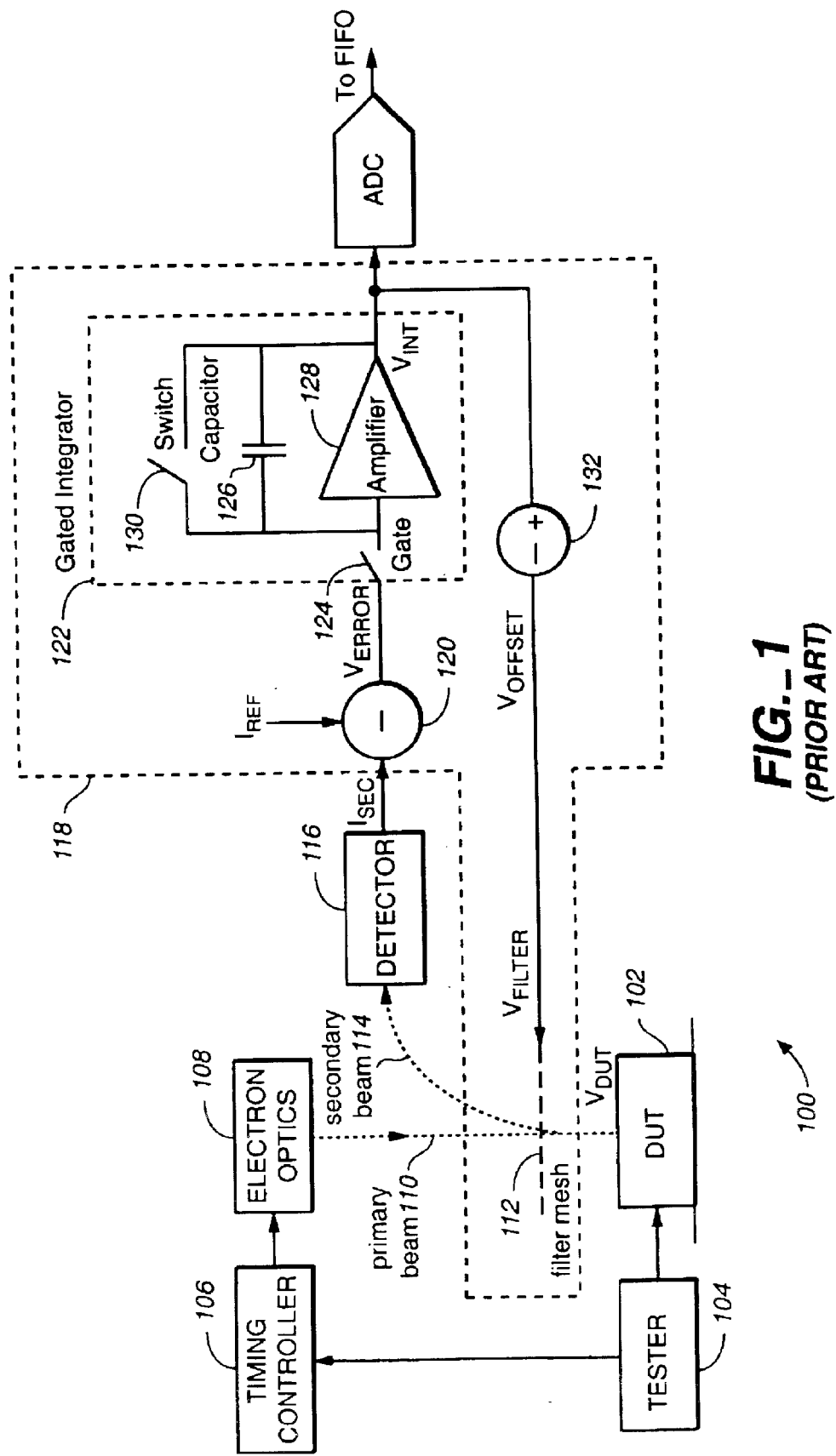
FIG._1
*(PRIOR ART)*

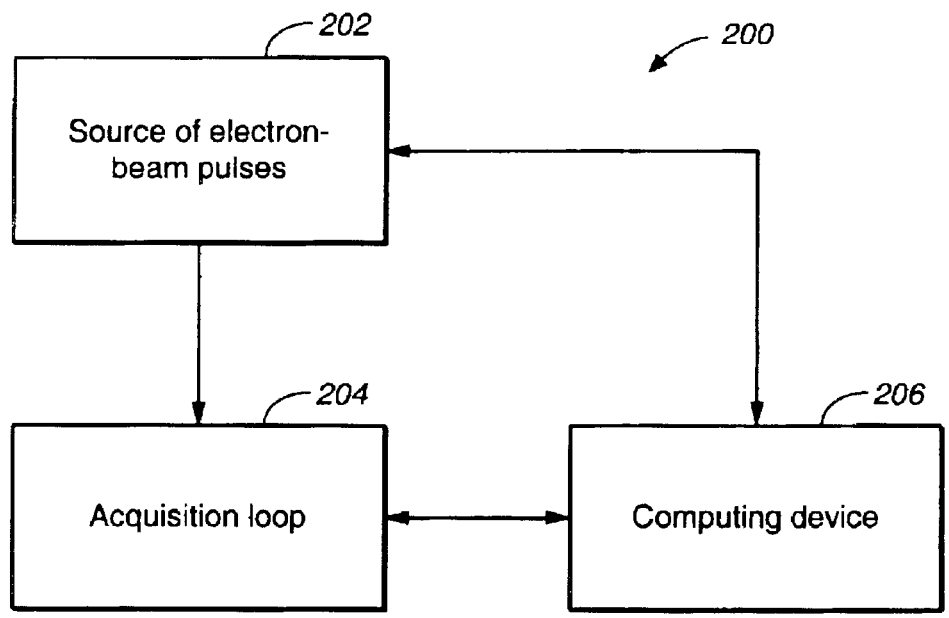
FIG._2
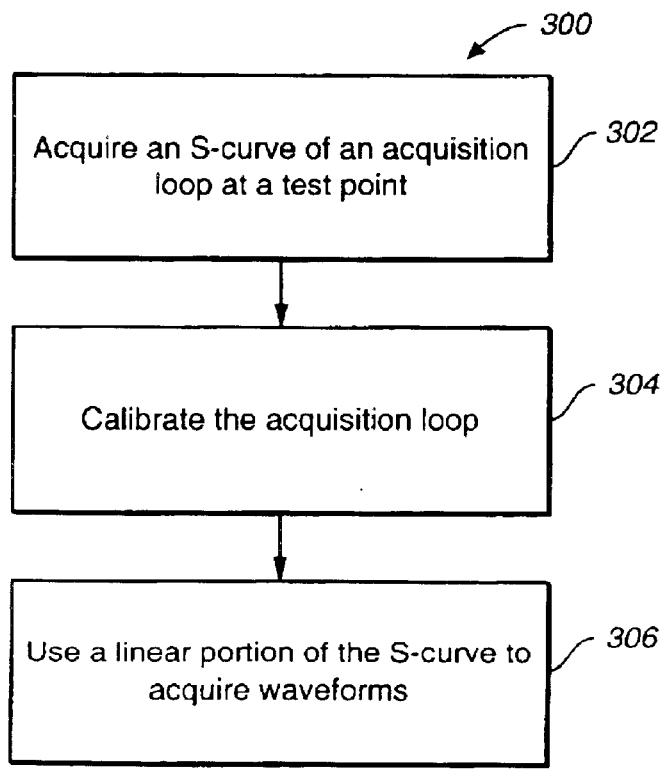
FIG._3

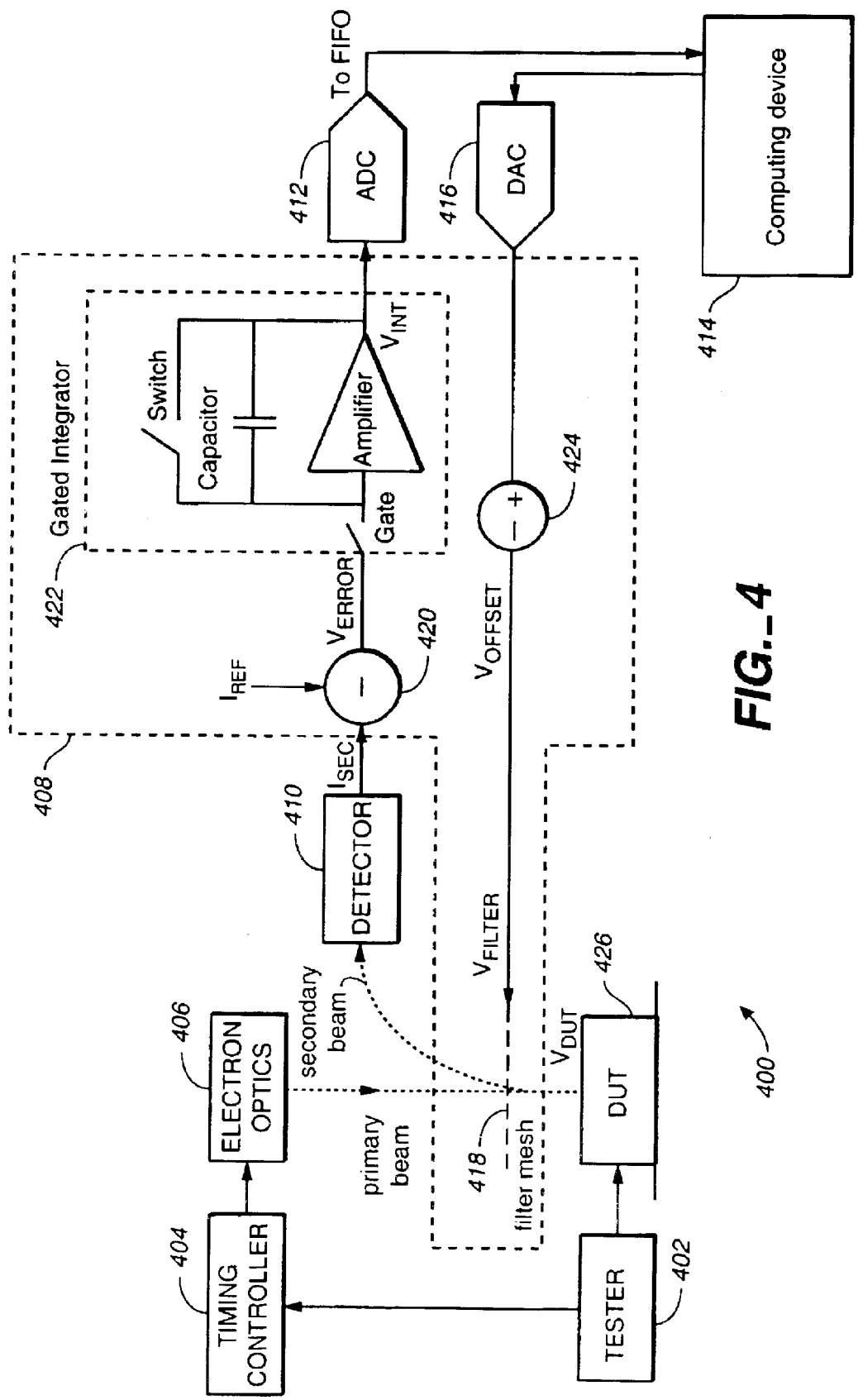
FIG._4

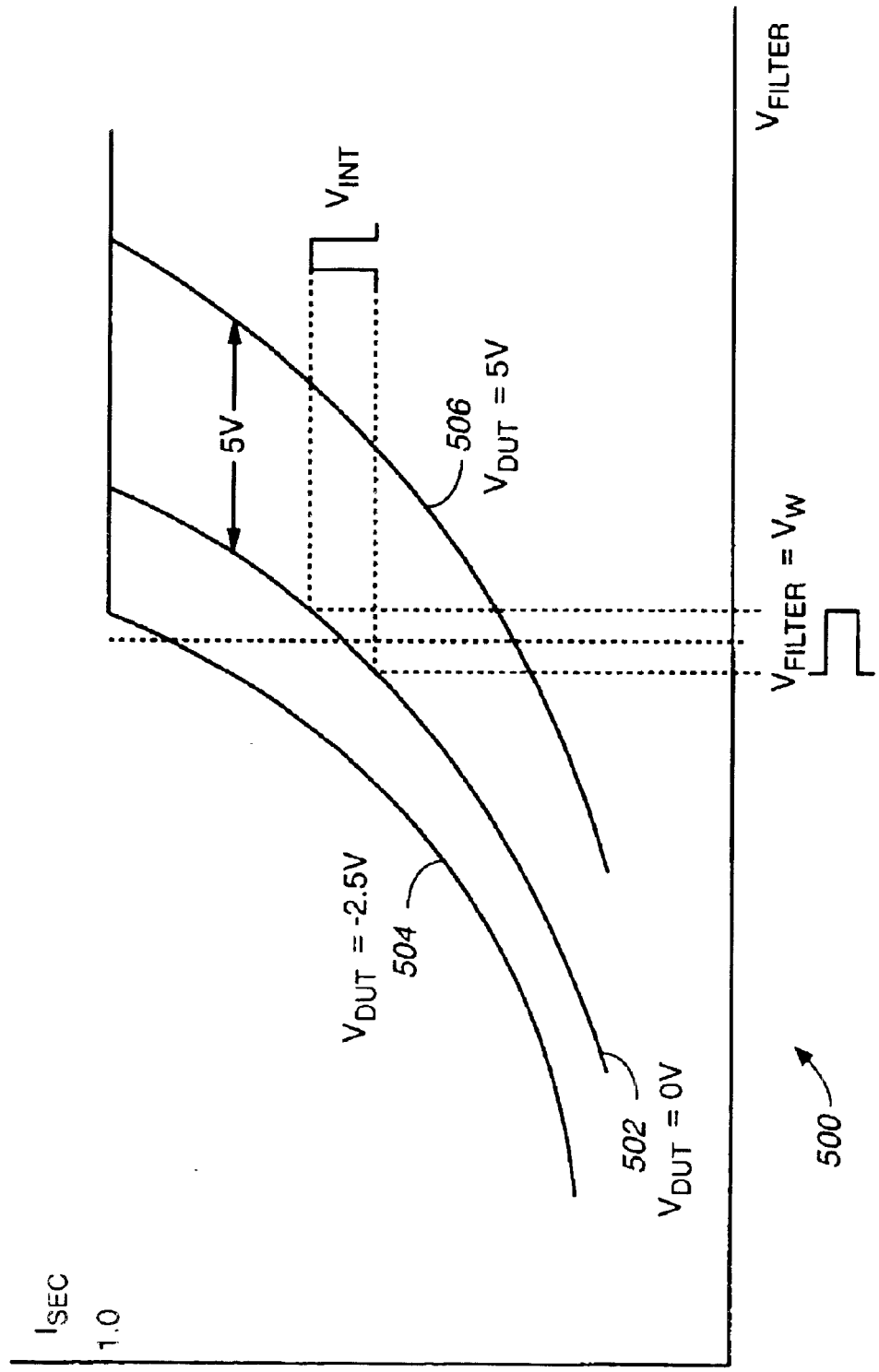
FIG._5

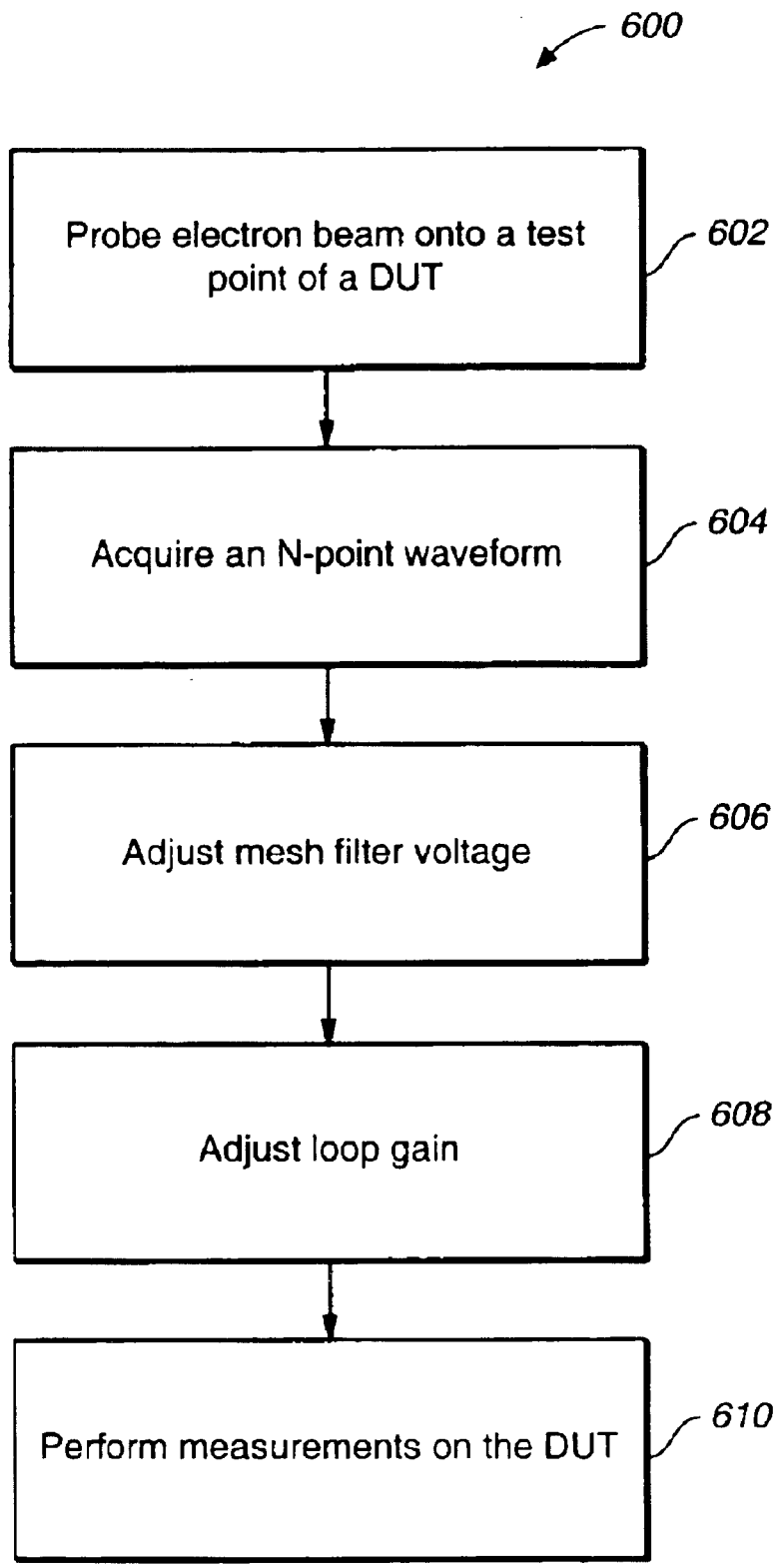
FIG._6

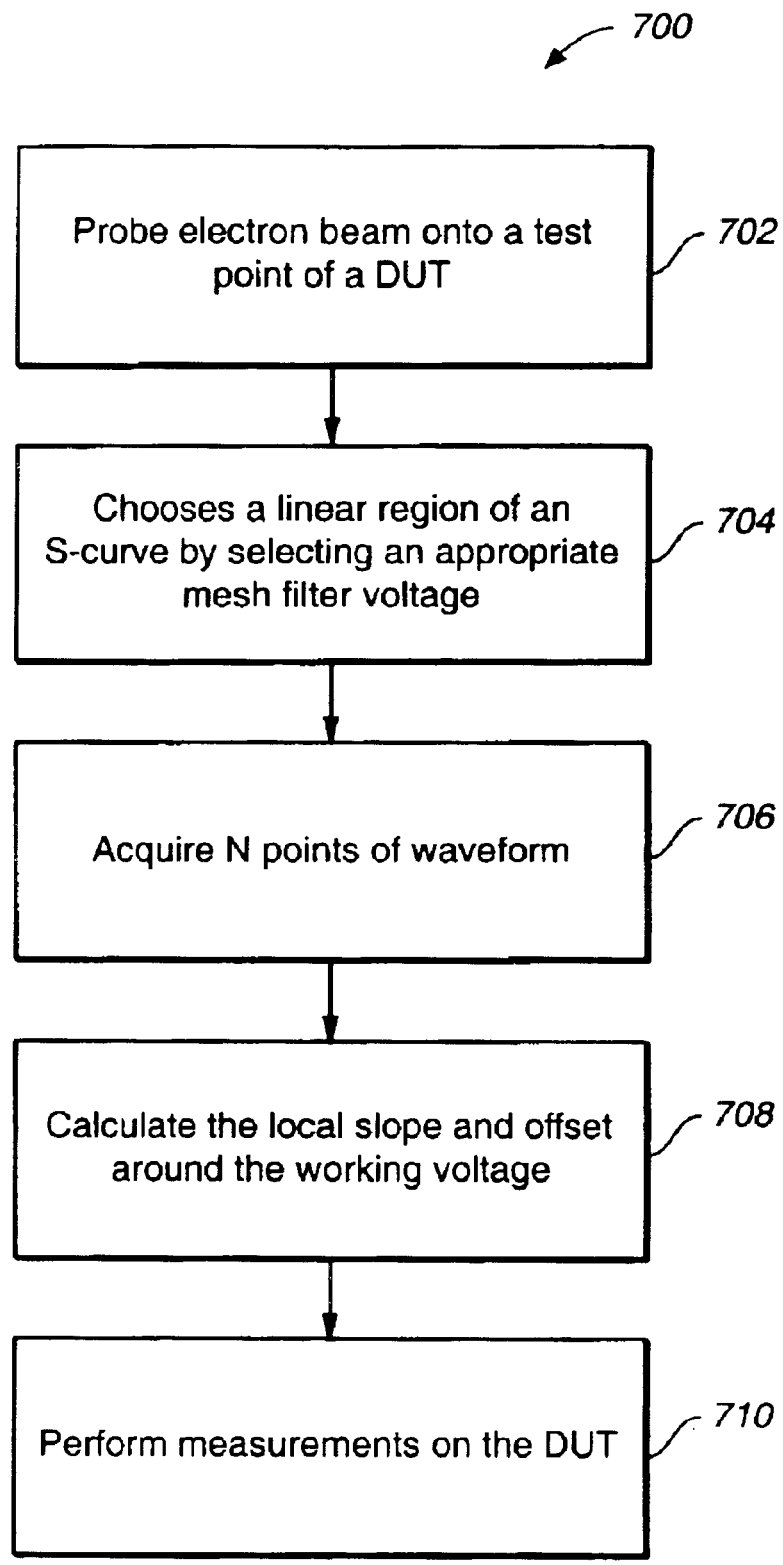
FIG._7

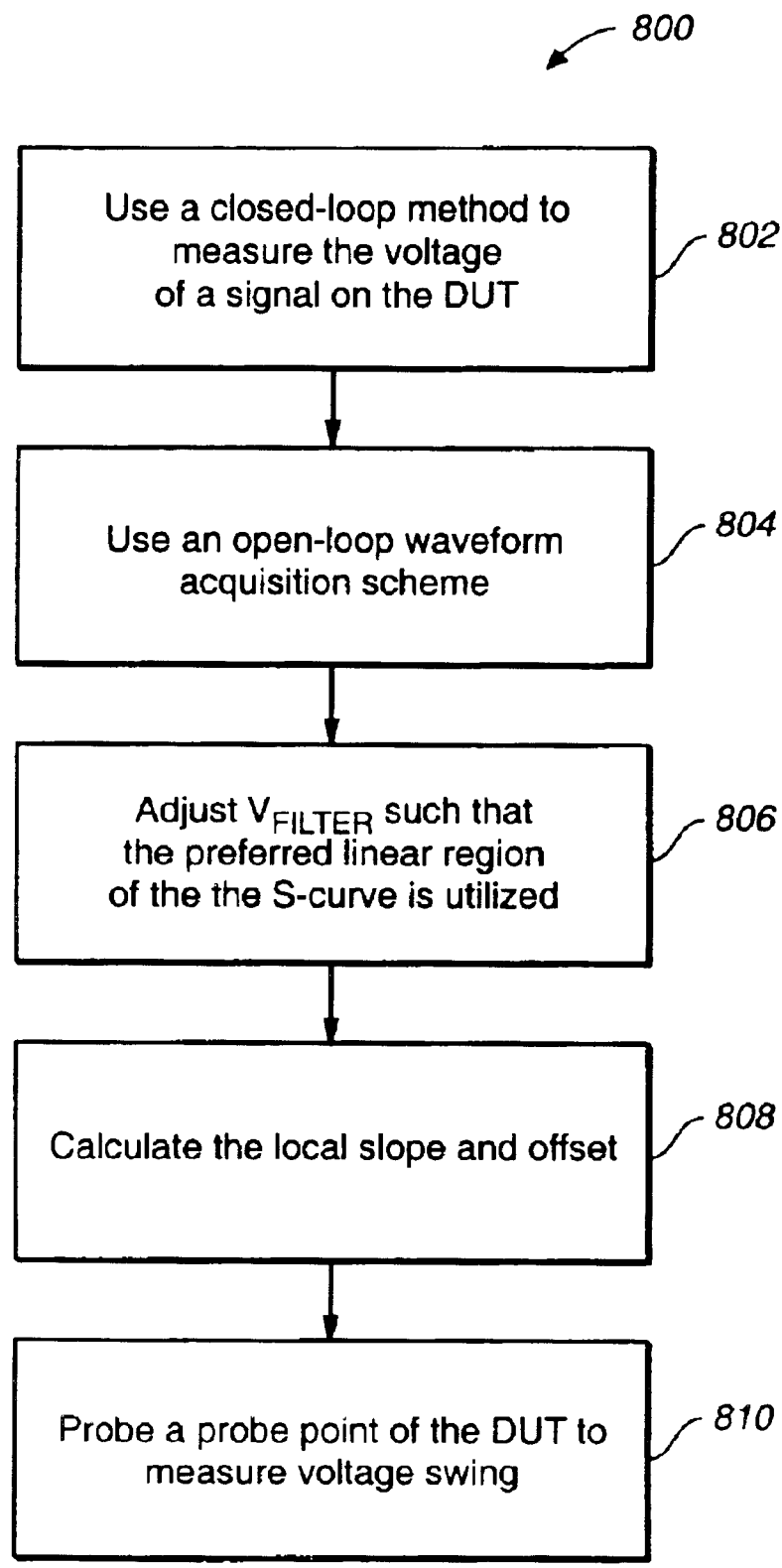
FIG._8

OPEN-LOOP FOR WAVEFORM ACQUISITION

This application claims the priority of U.S. Provisional Application Ser. No. 60/287,787, filed Apr. 30, 2001, which is hereby incorporated by reference in its entirety.

BACKGROUND

The present invention relates to waveform acquisition by electron-beam probe systems.

Conventional electron-beam probe systems implement a closed-loop scheme for acquiring waveforms. An example is the IDS 10000™ available from Schlumberger Technologies, Inc. of San Jose, Calif. A closed-loop acquisition scheme will be referred to as a closed-loop scheme.

There are several reasons for using closed-loop schemes. A feedback loop in a closed-loop scheme allows an acquisition loop output to linearly track voltage changes on a probe point. A probe point is the location where the electron-beam pulses are directed. Therefore, close-loop schemes generally allow a probe system to reliably measure voltages of a probe point on a device under test ("DUT").

FIG. 1 shows a conventional closed-loop electron-beam probe system 100. A tester 104 applies a pattern of test vectors to a DUT 102. At an appropriate point in time, the tester 104 triggers a timing controller 106. When triggered, the timing controller 106 supplies beam-pulse timing signals to an electron-optics device 108. In response to the beam-pulse timing signals, the electron-optics device 108 directs a primary electron-beam pulse 110 at a probe point of the DUT 102. The primary electron-beam pulse 110 is pulsed by a blanking circuit. The electrons from the primary electron-beam pulse 110 interacts with the probe point. This interaction generates low energy electrons, called secondary electrons, some of which have sufficient energy to overcome a potential barrier of a filter mesh 112 situated between the electron-optics device 108 and the DUT 102. That is, some of the secondary electrons have sufficient energy to escape the voltage difference between the probe point on the DUT 102 and the filter mesh 112. These secondary electrons form a secondary beam 114 that is detected by a detector 116, which produces a corresponding secondary-electron current, $I_{SEC}$. The secondary-electron current, $I_{SEC}$, varies non-linearly with changes in a surface potential, $V_{DUT}$, at the probe point on the DUT 102.

A feedback loop 118 linearizes the relationship between $I_{SEC}$ and $V_{DUT}$ by causing the filter mesh voltage, $V_{FILTER}$, to change proportionally with changes in $V_{DUT}$. That is, the feedback loop causes $V_{FILTER}$ to track $V_{DUT}$. The feedback loop includes a detector 116, subtractor 120, a gated integrator 122, a voltage offset 132, and the filter mesh 112. The subtractor receives as input a reference current, $I_{REF}$, and the secondary-electron current, $I_{SEC}$. The subtractor 120 generates an error signal, $V_{ERROR}$, whose amplitude is proportional to the difference between the secondary-electron current, $I_{SEC}$, and the reference current, $I_{REF}$. A device such as a constant current source generates the reference current, $I_{REF}$. The error signal, $V_{ERROR}$, is passed to a gated integrator 122. The gated integrator 122 includes a controlled gate 124, a capacitor 126, an amplifier 128, and a switch 130. The error signal, $V_{ERROR}$, passes through the controlled gate 124 to the capacitor 126 and amplifier 128. As a result, the gated integrator supplies an output voltage, which is referred to as integrator voltage or $V_{INT}$. The voltage at filter mesh 112, $V_{FILTER}$, is the sum of $V_{INT}$ minus a voltage offset 132, $V_{OFFSET}$, which suppresses the Type I Local Field Effect. The number of electrons with sufficient energy to overcome the potential barrier of filter mesh 112 is governed by the difference between $V_{DUT}$ and $V_{FILTER}$. When $V_{DUT}$ changes, the feedback loop 118 acts to maintain constant the number of electrons that overcome the potential barrier. That is, the feedback loop tries to keep the secondary-electron current, $I_{SEC}$, constant by varying $V_{INT}(=V_{FILTER}+V_{OFFSET})$. This stable condition is achieved when the change in $V_{FILTER}$ equals the change in $V_{DUT}$. That is, the filter voltage, $V_{FILTER}$, tracks (with a fixed $V_{OFFSET}$) variations in the surface potential $V_{DUT}$ of the probe point on the DUT 102. (The integrator voltage, $V_{INT}$, also tracks variations in the surface potential $V_{DUT}$ of the probe point on the DUT.) The switch 130 is closed before the start of each acquisition point in time to reset the gated integrator 122. The controlled gate 124 is closed during each beam-pulse interval so that the gating period coincides with the arrival of electrons in secondary beam 114 at detector 116, thus avoiding overcharging the gated integrator with the reference current and white noise generated by random secondary-electron current.

To obtain a waveform, measurement of $V_{DUT}$ as described above is repeated at multiple and periodic points in time after the tester 104 sends a trigger signal. These points in time are designated as $t_1, t_2, \ldots, t_m$ and represent time delays from the trigger time point. Measurements taken at multiple time points form a sweep. For many applications, 500 is a suitable number of time points. For each sweep, the points in time will be referred to by indices.

The measurements typically have undesirable white noise. The noise is usually random in nature and can be reduced by obtaining many sweeps and then averaging the sweeps. Usually, about sixteen to thirty-two sweeps are sufficient to reduce the white noise level.

The time needed to make an accurate measurement of the DUT voltage, i.e., the acquisition time, depends on the amount by which $V_{FILTER}$ has to change to settle the acquisition-loop. As $V_{FILTER}$ reaches the settled value, the difference between $I_{SEC}$ and $I_{REF}$ decreases. Consequently, the integrator charging slows down and, as a result, $V_{INT}$ settling slows down.

The acquisition time can be shortened somewhat while maintaining the advantages of stability and linearity of the closed-loop method. Factors that affect acquisition time include: the bandwidth of a secondary electron detector, the pulse width of the primary electron-beam, the degree that the primary electron-beam doses the DUT, the electron beam current, the capacitance of the integrator, the degree of photomultiplier ("PMT") gain, the tester trigger frequency, the signal-to-noise ratio, and the linearity of the relationship between changes in $V_{DUT}$ and $V_{FILTER}$.

The above factors can be optimized to reduce the acquisition time of a closed acquisition loop. However, even when the acquisition loop is optimized, the charging current still decreases as the acquisition-loop approaches settling conditions.

SUMMARY

The present invention provides methods and apparatus, including computer-program products, for an open-loop waveform acquisition scheme that references an S-curve of an acquisition loop.

Methods and apparatus in accordance with the invention take advantage of a linear portion of an S-curve and computer control to stabilize an open acquisition loop and to significantly reduce acquisition time. An S-curve is data that represents a response of an acquisition loop for a particular DUT. When calibrated, the S-curve provides a linear relationship between the detector current of the acquisition loop and the potential difference between the filter mesh voltage and probe point voltage.

In general, in one aspect, the invention provides a method for open-loop waveform acquisition. The method includes acquiring an S-curve of an acquisition loop of an electron-beam probe system. The S-curve represents a response of the acquisition loop to changes of potential differences between the acquisition loop and a device under test. The method includes calibrating the acquisition loop to obtain a linear region in the acquired S-curve and using the linear portion of the acquired S-curve to calculate voltage at a probe point of the device under test.

Aspects of the invention include one or more of the following features. Acquiring the S-curve can include varying the voltage difference between the acquisition loop and a device under test and measuring an output of the acquisition loop. Varying the voltage difference between the acquisition loop and a device under test can include varying a voltage of a calibration point of the device under test while keeping constant a voltage of a filter mesh that is part of the acquisition loop. Varying the voltage difference between the acquisition loop and a device under test can include varying a voltage of a filter mesh while keeping constant a voltage of a calibration point of the device under test, the filter mesh being part of the acquisition loop.

Calibrating the acquisition loop can include adjusting the filter mesh voltage to a linear portion of the acquired S-curve and adjusting the gain of the acquisition loop so that an output of the acquisition loop is directly proportional to voltage of the probe point. Calibrating the acquisition loop can include performing a linear regression to determine a slope and offset of the S-curve such that a voltage of the probe point is proportional to the output of the acquisition loop. Calibrating and calculating voltage at a probe point of the device under test can be combined. The method can include re-calibrating the acquisition loop to reduce errors.

In another aspect, the invention provides a charged-particle-beam probe system for probing voltage at a location of interest on a device under test. The system include a voltage source for supplying a filter voltage. The voltage source is calibrated based on acquired S-curve data of the device under test. The system includes a filter mesh charged by the filter voltage, and situated between the device under test and a detector, a beam source for applying to the location of interest a charged-particle-beam pulse at a selected delay $t_i$, a detector for detecting secondary charged-particles passing through the filter mesh producing a detector current ($I_{SEC}$), a current-combining circuit for combining the detector current with reference current to produce an error signal ($V_{ERROR}$), an integrator for integrating the error signal over a time period to produce an integrator voltage ($V_{INT}$) representative of the voltage at the location of interest and a computing device for storing a linear portion of the acquired S-curve data for use when calculating the voltage at the location of interest.

Aspects of the invention can include one or more of the following features. The voltage source can include a digital-to-analog converter connected to receive the acquired S-curve data from the computing device for supplying the filter voltage. The computing device can select a working point ($V_W$) so that the working point is within the linear portion of the S-curve, and drive the filter mesh to the working point. The integrator can include a capacitor, and a controllable switch for discharging the capacitor to reset the integrator voltage.

In another aspect, the invention provides an electron-beam probe system that includes a beam source for directing electrons at a probe point on a device under test, a filter mesh, and a detector for detecting electrons that have sufficient energy to overcome a voltage difference between a voltage at the filter mesh and the probe point. The detector produces an output that is proportional to the number of electrons it detects. The system includes a subtractor that receives the output of the detector and a reference input and produces an output that is proportional to the difference between the output of the detector and the reference input. The system includes an integrator that receives the output of the subtractor and produces an output that is linearly proportional to the voltage difference and a computing device that stores S-curve data for the electron-beam probe system, receives the output of the integrator, and calculates a voltage of the probe point, the calculation being based at least in part on the S-curve data.

In another aspect the invention provides a computer program product, tangibly stored on machine-readable medium, for calculating a voltage of a probe point on a device under test. The product includes instructions to cause a processor to receive an output of an open acquisition loop of a electron-beam probe system, retrieve S-curve data that describes changes in output of the acquisition loop in response to changes of a voltage difference between the acquisition loop and the probe point on the device under test and calculate the voltage of the probe point based on the retrieved S-curve data.

The invention can be implemented to realize one or more of the following advantages. A system in accordance with the invention makes open acquisition loops stable and reliable while significantly increasing acquisition speed. By increasing the acquisition speed, a lesser amount of electron beam dosing on the DUT is required, thus reducing charge contamination on the DUT allowing for more reliable measurements.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 shows a conventional waveform acquisition system.

FIG. 2 shows a waveform acquisition system in accordance with the invention.

FIG. 3 shows a method in accordance with the invention for open-loop waveform acquisition.

FIG. 4 shows another waveform acquisition system in accordance with the invention.

FIG. 5 shows examples of S-curves measured at different DUT voltages.

FIG. 6 shows a method in accordance with the invention for using the local linearity of the S-curve to measure $V_{DUT}$.

FIG. 7 shows another method in accordance with the invention for using the local linearity of the S-curve to measure $V_{DUT}$.

FIG. 8 shows another method in accordance with the invention for using the local linearity of the S-curve to measure $V_{DUT}$.

Like reference numbers and designations in the various drawings indicate like elements.

DETAILED DESCRIPTION

Open-Loop Systems for Wave-form Acquisition

FIG. 2 shows an open-loop waveform acquisition system 200 in accordance with the invention. The system includes a source of electron pulses 202, an acquisition loop 204, and a computing device 206. The acquisition loop 204 includes a filter mesh and an integrator that produces an output that is indicative of a voltage of a probe point. The acquisition loop 204 is configurable to be either a closed or open loop. The computing device 206 includes devices and computer-program products for receiving readings of, e.g., voltage or current at the output of the integrator, from the acquisition loop 204. The computing device 206 includes devices and computer program products for driving the voltage of a node such as the filter mesh of the acquisition loop 204. The computing device 206 includes devices and computer-program products for calculating the voltage of the probe point given an output of the integrator.

FIG. 3 shows a method 300 in accordance with the invention for acquiring waveforms. As shown, the system acquires an S-curve of an open acquisition loop, such as the acquisition loop 204, at a calibration point of a DUT (step 302). A calibration point of a DUT is the location on the DUT where the system measures potential to acquire an S-curve. The system uses the acquired S-curve to calibrate the acquisition loop such that changes of the output of the integrator are linearly proportional to changes of the voltage of the calibration point (step 304). The system acquires waveforms by directing electron-beam pulses as described at some location of interest such as a signal pad on the DUT, measuring the output of the integrator, and uses a linear portion of the S-curve of the calibrated loop to calculate the voltage of the location of interest (step 306). Alternatively, the system can combine the calibration and wave-form acquisition steps.

FIG. 4 shows another open-loop waveform acquisition system 400 in accordance with the invention. The system 400 includes a tester 402, a timing controller 404, electron optics 406, an acquisition loop 408, an analog-to-digital converter ("ADC") 410, a computing device 414, and a digital-to-analog converter ("DAC") 416.

The tester 402, timing controller 404, and electron optics 406 operate as described and shown in FIG. 1. The acquisition loop 408 includes a filter mesh 418, an electron detector 410, a subtractor 420, a gated integrator 422, and a voltage offset 424. The acquisition loop 408 can be opened by disconnecting the output of the gated integrator 422 and the filter mesh 418. That is, the acquisition loop 408 is open when the $V_{INT}$ node is not connected to the $V_{FILTER}$ node. The computing device 414 can include S-curve data that describes responses of the acquisition loop 408 for various different DUTs. The DAC 416 drives the filter mesh voltage in response to signals from the computing device 414. The ADC 412 digitizes analog signals, i.e., the integrator output voltage, for input into the computing device 414.

Acquiring the S-curve

There are various ways for the system 400 to acquire the S-curve of the DUT 426. Generally, the system 400 opens the acquisition loop 408, varies the voltage difference between the calibration point and the filter mesh 418, and measures the corresponding change in secondary current detected by the electron detector 410.

One method of measuring the S-curve requires setting the filter voltage at a fixed value while applying a triangle voltage signal to a calibration point on the DUT. The S-curve can be graphed by probing an electron beam onto the calibration point and plotting $V_{INT}$ as a function of the rising ramp of the triangle signal of $V_{DUT}$. The S-curve can be acquired for any given DUT by applying a triangle signal to a calibration point on the DUT from an external signal source. A pad connected to a pin can be designed for this purpose.

A second method of measuring the S-curve requires applying a triangle voltage signal through the DAC 416 to the filter mesh 418. For an unpassivated device, the electron beam can be probed onto a grounding pad or any pad with only a DC level. For a passivated device, the electron beam can be probed onto any location of the DUT where there is no voltage swing. The S-curve can be graphed by plotting $V_{INT}$ as a function of the rising ramp of the triangle signal of $V_{FILTER}$.

FIG. 5 shows an example graph of typical S-curves measured by sweeping $V_{FILTER}$ and detecting the transmitted secondary electrons. If the measurement is repeated for a different $V_{DUT}$, the S-curve is displaced laterally relative to the zero-bias S-curve 502 by an amount equal to $V_{DUT}$. For example, S-curve 504, measured at $V_{DUT}=-2.5V$, is displaced 2.5V to the left of the zero-bias S-curve 502 and S-curve 506, measured at $V_{DUT}=5V$, is displaced 5V to the right of the zero-bias S-curve 502.

The difference between the two methods of measuring the S-curve is that one method includes sweeping $V_{DUT}$ with $V_{FILTER}$ fixed, while the other method includes sweeping $V_{FILTER}$ with $V_{DUT}$ fixed. These two methods of measuring the S-curves quantitatively yield similar plot characteristics in that the detected secondary electron current, hence the integrator voltage $V_{INT}$, is determined by the voltage difference between $V_{FILTER}$ and $V_{DUT}$.

Calibrating the Acquisition Loop

There are several ways for the system to calibrate the acquisition loop 408. One way is to use linear regression. Another way is to adjust various parameters of the acquisition loop 408 so that the slope of the linear portion of the S-curve is maximized and that the relationship between changes in voltage at the calibration point results in a directly proportional change in voltage at the output of the gated integrator 422.

For example, the computing device 414 can use the S-curve data to drive the filter mesh voltage at an appropriate level. The computing device 414 sets the filter voltage, $V_{FILTER}$, at a fixed working point, $V_W (= V_{DAC} - V_{OFFSET})$ within a linear region of the S-curve during sampling, so that the generated $V_{INT}$ is directly proportional the voltage swing of the signal, $V_{DUT}$, at the probe point on the DUT 426.

Waveform Acquisition

To acquire a waveform at a point of interest on a DUT 426, the system 400 samples the surface potential of the probe point at various time intervals. The following describes a sampling operation. The tester 402 drives test vectors into the DUT 426. As discussed, the tester 402 triggers the timing controller 404, which causes the electron optics 406 to shoot pulses of electron beam, i.e., the primary electron beam pulses, at a probe point on the DUT 426. Some of the generated secondary electrons have sufficient energy to escape the potential difference between the filter mesh 418 and the probe point. The electron detector 410 detects these secondary electrons and generates a secondary current.

The potential at the probe point, i.e., $V_{DUT}$, changes as the DUT 426 responds to the test vectors provided by the tester 402. As the potential at the probe point changes, the number of electrons with sufficient energy to escape the filter mesh 418 changes, which causes the secondary current to change. In response to this change, the subtractor 420 generates an output potential, which causes the gated integrator 422 to generate a $V_{INT}$. The computing device 414 receives a digitized signal that represents $V_{INT}$ and calculates the potential at the probe point, i.e., $V_{DUT}$. The calculation is based on the S-curve of the calibrated acquisition loop 408.

An S-curve represents the relationship between the detected secondary current $I_{SEC}$, and the voltage difference between the filter mesh voltage and $V_{DUT}$ (i.e, $I_{SEC}$ is proportional to ($V_{FILTER}-V_{DUT}$)). As discussed, with appropriate calibration, the slope and the offset of the S-curve can be calculated (around working point $V_W=V_{FILTER}=V_{DAC}-V_{OFFSET}$). Hence, for any measured $V_{INT}$, a corresponding $V_{DUT}$ (with an offset) can be calculated. Because $V_{FILTER}$ is fixed during measurement, the resulting swing of $V_{INT}$ is actually the swing of the signal on the DUT 426.

EXAMPLES

Described below are several example methods of acquiring waveforms in accordance with the invention. The example methods use the local linearity of the S-curve to calculate the filter voltage, $V_{FILTER}$, in an open-loop waveform acquisition scheme.

FIG. 6 shows a method 600 for preparing an acquisition loop for waveform acquisition in accordance with the invention. A system such as the system 400 probes electron beam onto a calibration point of a DUT (step 602). To measure a waveform on a passivated point, the electron beam can be probed onto any passivated area with no voltage contrast. To measure a waveform on an unpassivated point, the electron beam can be probed onto an unpassivated point with a DC level, (e.g., bonding pad known to be ground).

The system acquires an N-point waveform (step 604). In one implementation, the system acquires a 500-point waveform. The 500-point waveform can be acquired by driving an alternating square wave with a high of ($V_X$+500 mV) and a low of ($V_X$-500 mV), where $V_X$ represents the adjustable working point. The filter mesh voltage can be changed by adjusting a voltage slider on a user interface provided by a computing device such as computing device 414. The square wave can alternate every 64 indices (or any number of indices). As shown in FIG. 5, the difference between $V_{DUT}$ and $V_{FILTER}$ generates a waveform of $V_{INT}$.

Preferably, the system adjusts the filter voltage slider to obtain the largest (and non-distorted) waveform (step 606). Note that there is a $V_{OFFSET}$ applied on the filter to suppress the Type I local field effect. The largest waveform can be obtained by obtaining as large a slope as possible. It is from this working voltage, $V_W$, that the local linearity of the S-curve yields the best results.

The system fine tunes the gain of the acquisition loop by, e.g., adjusting the PMT gain to generate a 1V waveform (step 608), such that a 1V change in $V_{DUT}$ produces a 1V change in $V_{INT}$.

The system performs measurements of the DUT to acquire waveforms (step 610). The electron beam can be probed onto any point of the DUT. The measured swing of $V_{INT}$ reflects the swing of $V_{DUT}$.

FIG. 7 shows a method 700 for preparing an acquisition loop for waveform acquisition in accordance with the invention. The system probes an electron beam onto a calibration point of a DUT (step 702). As described above, the system can probe the electron beam onto a passivated point or an unpassivated point.

The system chooses a linear region of an S-curve by selecting an appropriate filter mesh voltage, which is the working voltage $V_W$, which in the system of FIG. 4 is equal to the voltage output of the DAC minus the offset voltage (step 704). To select the appropriate mesh voltage, the following describes one way the system can select the appropriate mesh voltage. The system can, e.g., apply a triangle waveform with a high of $V_{DAC}=V_{MAX}=(V_X+500$ mV-$V_{OFFSET})$ and a low of $V_{DAC}=V_{MIN}=(V_X-500$ mV-$V_{OFFSET})$, where $V_X$ is adjustable from a user interface. $V_X$ can be adjusted to produce a triangular waveform for $V_{INT}$. The system may need to reduce the amplitude of the triangle waveform applied at the filter mesh if the system cannot adjust $V_X$ to produce a triangular waveform for $V_{INT}$—i.e., a linear portion of the S-curve can be found by reducing the amplitude of the triangular waveform. The system adjusts the gain of the acquisition loop by, e.g., adjusting PMT gain to get a reasonably magnified $V_{INT}$ swing. It is from this working voltage, $V_W$, where the preferred linear region of the S-curve lies.

When $V_{INT}$ is in a triangular waveform, the system acquires N points of waveform (step 706). N can be 500. The system calculates the local slope and offset around the working point $V_W$ (step 708). The N points of data can be used to calculate the local slope and offset of the S-curve around the working point $V_W$ by implementing a linear regression technique as described below. By solving equations 2 and 3, the slope a and offset b is obtained.

$$V_{INT_i} = aV_{FILTER_i} + b \text{ for } i = 0, 1, \ldots, N-1 \quad \text{(eq. 1)}$$

$$\text{Let } T = \sum_i (V_{INT_i} - aV_{FILTER_i} - b)$$

$$\partial T/\partial a = 0 \ \Rightarrow\ \sum_i (V_{INT_i} - aV_{FILTER_i} - b)V_{FILTER_i} = 0 \quad \text{(eq. 2)}$$

$$\partial T/\partial b = 0 \ \Rightarrow\ \sum_i (V_{INT_i} - aV_{FILTER_i} - b) = 0 \quad \text{(eq. 3)}$$

The system performs measurements of the DUT to acquire waveforms (step 710). For any measured $V_{INT}$, $V_{FILTER}$ can be calculated. Because $V_{FILTER}$ is fixed during measurement, the calculated swing of $V_{FILTER}$ reflects the swing of $V_{DUT}$.

FIG. 8 shows a method 800 for preparing an acquisition loop for waveform acquisition in accordance with the invention. The system uses a closed-loop method to measure the voltage of a signal on the DUT (step 802). Known signals, such as a clock signal, a data signal, a register address signal, a chip select signal, etc., can be used in situations when an external signal cannot be easily applied to a pad on the DUT. These signals can usually be found on the bonding pads of the DUT and can be measured quickly by using a conventional closed-loop method.

Once the voltage swing of $V_{DUT}$ is known, an open-loop waveform acquisition scheme can be used (step 804). $V_{FILTER}$ is adjusted such that the preferred linear region of the S-curve is utilized (step 806). The local slope and offset of the S-curve is calculated (step 808). A linear regression technique as described above can be used to calculate the local slope and offset of the S-curve (i.e., $V_{DUT_i}$ can be substituted for $V_{FILTER_i}$). Once the slope and offset is calculated, a user can probe onto any probe point to measure the signal swing of $V_{DUT}$ using the open-loop waveform acquisition scheme (step 810).

It is possible to combine the calibration and waveform acquisition steps. The system calibrates the acquisition loop so that the local linearity (as much as 1 volt) exists in a fairly large range of filter mesh voltages. For any logic signal or small amplitude (i.e., less than 1 volt) analog waveform acquisition, the output of the gated integrator, i.e., $V_{INT}$, has a linear relationship with the difference between $V_{DUT}$ and $V_{FILTER}$. That is, $$V_{INT}=a(V_{DUT}-V_{FILTER})+b \qquad (eq.\ 4)$$

where a is the slope and b is the constant (for a particular local linear region) offset. Equation 4 can be placed into a format that is similar to equation 1. That is, equation 4 can be written as $$V_{INT_i}=a(V_{DUT_i}-V_{FILTER_i})+b=-aV_{FILTER_i}+(aV_{DUT_i}+b) \qquad (eq.\ 5)$$

During calibration, the system probes at a DUT location with no signal swing such that $V_{dut_i}$ remains constant. Consequently, equation 5 can be written as, $$V_{INT_i}=a'V_{FILTER}+b' \qquad (eq.\ 6)$$

The system measures $V_{INT}$ in a sweep of N time points. N can be, e.g., 500. For the measurement, the system varies the filter mesh voltage by a small amount. That is, $V_{FILTER}$ (=$V_{DAC}-V_{OFFSET}$) and $V_{DAC}=V_W+\delta$. $V_W$ is a constant voltage that is adjusted once for every installed DUT to ensure the DUT will not fall into the saturation region of the S curve. (For an example of the saturation region, see FIG. 5.) $\delta$ is a small voltage value, such as 0.01V, to which the system varies filter mesh voltage. The system performs another sweep with $V_{DAC}=V_W-\delta$.

Two equations are given for the two sweeps of measurements as follows:

$$V_{INT_i}=a(V_{DUT_i}-V_W-\delta-V_{OFFSET})+b+\epsilon_i, i=1,2,\ldots,N \qquad (eq.\ 7)$$

$$V_{INT_j}=a(V_{DUT_j}-V_W+\delta-V_{OFFSET})+b+\epsilon_j, j=1,2,\ldots,N \qquad (eq.\ 8)$$

where $\epsilon i$ and $\epsilon j$ are modeled as white noise, DUT charge up, Type I Local Field Effect, and other errors. For details on the Type I Local Field Effect, see "Local Field Effect and Device Voltage Measurement", ISSUES in VLSI Diagnostics & Test, Vol. 1, Schlumberger, July 1987. Each of these time points of the second sweep has the same delay to trigger as its counterpart of the previous time point measurement. That is, $V_{DUT_i}=V_{DUT_j}$, for any i=j.

The system subtracts equation 8 from equation 7, and sum the N points, to obtain $$\Sigma_{i,j}(V_{INT_i}-V_{INT_j})=-2aN\delta+\epsilon \qquad (eq.\ 9)$$

where $\epsilon$ represents errors. By the above subtraction, the last two error factors can be mostly or partially removed. And after the $\Sigma$ summation, $\epsilon$ is expected to be insignificant compared with the other two terms in equation 9. (The signal-to-noise ratio for this summation increases $N^{1/2}$.) Therefore, $$a=-\Sigma_{1,j}(V_{INT_i}-V_{INT_j})/(2N\delta) \qquad (eq.\ 10)$$

Once the system calculates this slope, the system can calculate Vdut as follows, $$V_{DUT_k}=(V_{DUT_i}+V_{DUT_j})/2=(V_{INT_i}+V_{INT_j})/(2a)+V_W+V_{OFFSET}-b/a-(\epsilon_i+\epsilon_j)/(2a)k,i,j=1,2,\ldots,N \qquad (eq.\ 11)$$

where: $V_{INT_i}$ and $V_{INT_j}$ are measured values; a is given by (5); $V_W$ and $V_{OFFSET}$ are known constants; and b and ($\epsilon_i+\epsilon_j$) are unknown. Because what the system measures are voltage swings, the system can ignore b here. As discussed, the term ($\epsilon_i+\epsilon_j$) represents measurement errors such as white noise, LFE-I effect, and non-linearity. These errors exists in other methods and can be minimized during system design. The described method is well suited for measuring logic waveform or small amplitude analog signals. Notice the white noise, the signal-to-noise ratio has been improved by $2^{1/2}$, as the system performs two sweeps of measurement. The system optionally performs more sweeps to further reduce errors. As more sweeps are performed, the system can calculate a more averaged slope a and a more averaged waveform from $V_{DUT_k}$ (where k=1, 2, ..., N).

Re-Calibration

If the DUT surface voltage potential changes, due to charging, contamination, or a DC offset change on a bare metal pad, continued use of the pre-calibrated system to measure output waveforms may result in errors of measurement. When the DUT surface voltage potential changes, re-calibration may be necessary. For a passivated DUT, re-calibration of the system can be achieved by probing a probe point to a nearby region off the signal pad and using the local linearity of the S-curve as described above to re-calibrate the system. The nearby region used for re-calibration should have the same level of charging and contamination as that on the signal pad. For a bare metal pad, which can have a different DC offset as compared to the pre-calibrated pad, a conventional closed-loop method can be used. In some extreme cases, such as a long test loop (e.g., a very low trigger frequency), using a closed-loop method can take up to 30 minutes to complete 500 timing points of waveform measurement. In such a case, a user can re-calibrate the system according to the method as shown in FIG. 8. First, a closed-loop method can be implemented to acquire a 100-point waveform. If the measured waveform is a logic waveform, then the signal can be used to re-calibrate the open-loop waveform acquisition scheme. Once the open-loop acquisition scheme is re-calibrated, the user can probe the electron-beam onto the same pad and continue the open-loop acquisition scheme.

Other acquisition parameters (such as capacitor size, and reference current size) can be optimized.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. The essential elements of a computer are a processor for executing instructions and a memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs ("application-specific integrated circuits").

To provide for interaction with a user, the invention can be implemented on a computer system having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

A number of embodiments of the invention have been described. Nevertheless, it will be understood that various modifications may be made without departing from the spirit and scope of the invention. For example, the predicted filter voltage need not be prepared by supplying a digital value to a DAC, but can be supplied from a controllable analog voltage source. The filter voltage need not be predicted from a prior measurement or an average of prior measurements, but can instead be predicted from a simulation of the expected operation of the DUT or from any other desired source. The computing device can use a lookup table to store S-curve data. Accordingly, other embodiments are within the scope of the following claims.

What is claimed is:

1. A method for open-loop waveform acquisition, the method comprising:
    acquiring an S-curve of an acquisition loop of an electron-beam probe system, the S-curve representing a response of the acquisition loop to changes of potential differences between the acquisition loop and a probe point; and
    using the acquired S-curve to calibrate the acquisition loop so that a change in voltage at an output of the acquisition loop is directly proportional in a 1-to-1 ratio to a change in a voltage at the probe point.

2. The method of claim 1, wherein acquiring the S-curve includes:
    varying a voltage difference between the acquisition loop and the probe point; and
    measuring an output of the acquisition loop.

3. The method of claim 2, wherein varying the voltage difference between the acquisition loop and the probe point includes:
    varying a voltage at the probe point of while keeping constant a voltage of a filter mesh that is part of the acquisition loop.

4. The method of claim 2, wherein varying the voltage difference between the acquisition loop and the probe point includes:
    varying a voltage of a filter mesh while keeping constant a voltage of the probe point, the filter mesh being part of the acquisition loop.

5. The method of claim 1, wherein calibrating the acquisition loop includes:
    adjusting a filter mesh voltage to a linear portion of the acquired S-curve, the filter mesh being part of the acquisition loop; and
    adjusting a gain of the acquisition loop so that a change in voltage at an output of the acquisition loop is directly proportional in a 1to-1 ratio to a change in a voltage at the probe point.

6. The method of claim 1, wherein calibrating the acquisition loop includes:
    performing a linear regression to determine a slope and offset of the acquired S-curve such that a change in a voltage at the probe point is directly proportional in a 1 to 1 ratio to a change in voltage at an output of the acquisition loop.

7. The method of claim 1, further comprising performing a voltage measurement at a location of interest on a device under test including probing the probe point to the location of interest, wherein a measured voltage swing of the output of the acquisition loop reflects in a 1-to-1 ratio a measured voltage swing of the voltage at the location of interest due to the calibrated acquisition loop.

8. The method of claim 7, wherein the steps of calibrating and performing a voltage measurement at a location of interest on a device under test are combined.

9. The method of claim 1, further comprising:
    re-calibrating the acquisition loop to reduce errors.

10. The method of claim 1, wherein using the acquired S-curve to calibrate the acquisition loop includes:
    adjusting a voltage of a filter mesh to a linear region in the acquired S-curve, the filter mesh being part of the acquisition loop; and
    adjusting a gain of the acquisition loop so that a change in a voltage at the probe point of is directly proportional in a 1-to-1 ratio to a change in voltage at the output of the acquisition loop.

11. A charged-particle-beam probe system for measuring voltage at a location of interest on a device under test, the system comprising:
    a voltage source to supply a filter voltage, the filter voltage having been pre-calibrated to a linear region in acquired S-curve data of a device under test so that a change in a voltage at a probe point of the charged-particle-beam probe system is directly proportional in a 1-to-1 ratio to a change in voltage at an output of an integrator;
    a filter mesh charged by the filter voltage, and situated between a device under test and a detector;
    a beam source to apply to the location of interest a charged-particle-beam pulse at a selected delay $t_i$;
    a detector to detect secondary charged-particles passing through the filter mesh producing a detector current ($I_{SEC}$);
    a current-combining circuit to combine the detector current with a reference current to produce an error signal ($V_{ERROR}$); and
    the integrator to integrate the error signal over a time period to produce an integrator voltage ($V_{INT}$), wherein the integrator voltage ($V_{INT}$) is representative of the voltage at the location of interest due to the filter mesh being charged at the pre-calibrated filter voltage.

12. The system of claim 11, wherein the voltage source comprises a digital-to-analog converter connected to receive the acquired S-curve data from the computing device for supplying the filter voltage.

13. The system of claim 12, wherein the computing device further selects a working point ($V_W$) so that the working point is within the linear portion of the S-curve data, and drives the filter mesh to the working point.

14. The system of claim 11, wherein the integrator comprises a capacitor, and a controllable switch for discharging the capacitor to reset the integrator voltage.

15. An electron-beam probe system, comprising:

a beam source to direct electrons at a probe point on a device under test;

a filter mesh having been pre-calibrated to a voltage within a linear region in acquired S-curve data of a device under test so that a change in a voltage at a probe point of the electron-beam probe system is directly proportional in a 1-to-1 ratio to a change in voltage at an output of an integrator;

a detector to detect a number of electrons that have sufficient energy to overcome a voltage difference between a voltage at the filter mesh and the probe point, the detector producing an output that is proportional to the number of electrons that the detector detects;

a subtractor to receive the output of the detector and a reference input, the subtractor to produce an output that is proportional to the difference between the output of the detector and the reference input;

the integrator to receive the output of the subtractor and produce an output that is linearly proportional to the voltage difference, wherein a measured voltage swing of the output of the integrator reflects a measured voltage swing of the voltage at the probe point due to the filter mesh having been pre-calibrated.

16. The system of claim 15, wherein the computing device further selects a working point ($V_W$) so that the working point is within the linear portion of the S-curve, and drives the filter mesh to the working point.

17. A computer program product, tangibly stored on machine-readable medium, for driving a voltage of a filter mesh of an electron-beam probe system, the product including instructions to cause a processor to:

receive an output of an open acquisition loop of a an electron-beam probe system;

retrieve S-curve data that describes changes in output of the acquisition loop in response to changes of a voltage difference between a filter mesh and a probe point on a device under test, the filter mesh being part of the acquisition loop; and drive the voltage of the filter mesh to a fixed working point ($V_W$) within a linear region of the S-curve data so that a change in a voltage at a probe point of the electron-beam system is directly proportional in a 1-to-1 ratio to a change in voltage at an output of the acquisition loop.

18. A method for open-loop waveform acquisition using an electron-beam probe system, the method comprising:

acquiring an S-curve of an acquisition loop of an electron-beam probe system, the S-curve representing a response of the acquisition loop to changes of potential differences between a filter mesh and a device under test, the filter mesh being part of the acquisition loop;

calibrating the acquisition loop including adjusting a voltage of the filter mesh to a fixed working point ($V_W$) within a linear region in the acquired S-curve; and performing a voltage measurement at a location of interest on a device under test including probing a probe point of the electron-beam probe system to the location of interest; and determining a voltage swing at the location of interest while maintaining the voltage of the filter mesh at the fixed working point ($V_W$).

19. The method of claim 18, wherein calibrating the acquisition loop further includes adjusting a gain of the acquisition loop so that a change in a voltage at a probe point of the electron beam system is directly proportional in a 1-to-1 ratio to a change in voltage at an output of the acquisition loop.

* * * * *

UNITED STATES PATENT AND TRADEMARK OFFICE
CERTIFICATE OF CORRECTION

PATENT NO. : 6,853,941 B2
DATED : February 8, 2005
INVENTOR(S) : Hui Wang, Kenichi Kanai and Hiroyasu Koike It is certified that error appears in the above-identified patent and that said Letters Patent is hereby corrected as shown below:

Column 11,
Line 52, replace "varying a voltage at the probe point of while keeping" with
-- varying a voltage at the probe point while keeping --

Column 12,
Line 28, replace "in a voltage at the probe point of is directly proportional" with
-- in a voltage at the probe point is directly proportional --

Signed and Sealed this

Seventh Day of June, 2005

JON W. DUDAS
*Director of the United States Patent and Trademark Office*